United States Patent
Madsen et al.

(10) Patent No.: US 7,340,235 B1
(45) Date of Patent: Mar. 4, 2008

(54) SYSTEM FOR LIMITING CURRENT IN AN OUTPUT STAGE OF A POWER AMPLIFIER

(75) Inventors: Ulrik Riis Madsen, Herning (DK); Darrell G. Epperson, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 563 days.

(21) Appl. No.: 11/050,147

(22) Filed: Feb. 3, 2005

Related U.S. Application Data

(60) Provisional application No. 60/603,129, filed on Aug. 20, 2004.

(51) Int. Cl.
*H04B 1/06* (2006.01)
(52) U.S. Cl. .............................. 455/240.1; 455/127.2; 375/345; 330/254
(58) Field of Classification Search ................ 455/126, 455/127.1, 127.2, 232.1, 234.1, 240.1, 250.1; 375/295, 345; 330/149, 254, 285, 289
See application file for complete search history.

(56) References Cited

U.S. PATENT DOCUMENTS

| | | | |
|---|---|---|---|
| 5,126,688 A | 6/1992 | Nakanishi et al. | |
| 5,182,527 A | 1/1993 | Nakanishi et al. | |
| 5,834,975 A | 11/1998 | Bartlett et al. | |
| 6,633,750 B1* | 10/2003 | Dacus et al. | 455/126 |
| 6,734,724 B1 | 5/2004 | Schell et al. | |
| 6,844,776 B2 | 1/2005 | Schell et al. | |
| 7,085,544 B2* | 8/2006 | Takano et al. | 455/102 |
| 7,110,724 B1* | 9/2006 | Epperson et al. | 455/72 |
| 7,139,538 B2* | 11/2006 | Ono et al. | 455/127.1 |
| 7,190,935 B2* | 3/2007 | Hecht | 455/127.1 |
| 2006/0148430 A1* | 7/2006 | Leizerovich et al. | 455/127.1 |

* cited by examiner

*Primary Examiner*—Edward F. Urban
*Assistant Examiner*—Nhan T. Le
(74) *Attorney, Agent, or Firm*—Withrow & Terranova, PLLC

(57) ABSTRACT

A system and method for limiting current in an output stage of power amplifier circuitry in a transmitter of a mobile terminal are provided. In general, the current in the output stage of the power amplifier circuitry is detected during each transmit burst from the power amplifier circuitry. For each transmit burst, an error correction value for a corresponding power level is determined based on the detected current and a predetermined threshold value. The error correction value is used to correct an adjustable power control signal that controls the power level of the power amplifier circuit for a subsequent transmit burst at the same power level.

26 Claims, 7 Drawing Sheets

SYSTEM FOR LIMITING CURRENT IN AN OUTPUT STAGE OF A POWER AMPLIFIER

CROSS-REFERENCE TO RELATED APPLICATIONS

This application claims the benefit of provisional patent application Ser. No. 60/603,129, filed Aug. 20, 2004, the disclosure of which is hereby incorporated by reference in its entirety.

This U.S. patent application is related to the concurrently filed U.S. patent application entitled SYSTEM FOR DETECTING CURRENT IN AN OUTPUT STAGE OF A POWER AMPLIFIER by Epperson et al., which is hereby incorporated by reference in its entirety.

FIELD OF THE INVENTION

The present invention relates to power amplifiers and particularly relates to limiting current in an output stage of a power amplifier.

BACKGROUND OF THE INVENTION

One of the primary goals in designing mobile telephones is to reduce power consumption in order to increase battery-life. In large part, the power consumption of a mobile telephone is dependent upon the amount of current drawn by a power amplifier in the transmit chain that operates to amplify a transmit signal prior to sending the signal to the antenna for transmission. In general, the power amplifier is designed to operate based on an ideal load at the antenna. However, due to factors such as how a user is holding the phone and the distance between the antenna and the user's body, the load seen by the power amplifier varies. Thus, a mismatch is created between the power amplifier and the antenna. For example, the power amplifier may be designed to operate with an ideal load of 50 ohms. However, a user may hold a phone such that the load seen at the antenna is 25 ohms, thereby creating a 2:1 mismatch. This mismatch can be as large as 10:1 and may cause a large amount of current to flow through the power amplifier, thereby reducing the battery-life of the mobile telephone. If the current draw is large, the battery voltage will drop due to the internal resistance to an extent where the phone will shut down. This is especially true if the battery is nearly discharged. Accordingly, there remains a need for a system that limits the current in the power amplifier in order to prevent large amounts of current from flowing through the power amplifier due to load mismatch.

SUMMARY OF THE INVENTION

The present invention provides a system and method for limiting current in an output stage of power amplifier circuitry in a transmitter of a mobile terminal. In general, the current in the output stage of the power amplifier circuitry is detected during each transmit burst from the power amplifier circuitry. For each transmit burst, an error correction value or a set of error correction values for a corresponding power level is determined based on the detected current and a predetermined threshold value. The error correction value is used to correct an adjustable power control signal that controls the power level of the power amplifier circuit for a subsequent transmit burst at the same power level.

In one embodiment, the present invention provides a mobile terminal including power amplifier circuitry, power control circuitry, current detection circuitry, and a control system. The power amplifier circuitry operates to amplify a transmit signal based on a supply voltage generated by the power control circuitry. The power control circuitry generates the supply voltage based on a source voltage and an adjustable power control signal from the control system. The adjustable power control signal selects a power level of the power amplifier circuitry and may, in one embodiment, be used to control amplitude modulation of the transmit signal by the power amplifier circuitry. The current detection circuitry operates to provide a detection signal, which may be either a voltage or a current, that is indicative of the current in the output stage of the power amplifier circuitry. Based on the value of the detection signal during a transmit burst at one of numerous possible power levels, the control system determines the current in the output stage of the power amplifier circuitry and generates an error correction value for the power level. The error correction value is used to adjust a value of the adjustable power control signal corresponding to the power level such that the current in the output stage of the power amplifier circuitry is limited to a predefined threshold value.

In one embodiment, the current detection circuitry operates to provide the detection signal based on a voltage across an inductor coupled between the power control circuitry and the power amplifier circuitry, where the supply voltage is provided to the power amplifier circuitry via the inductor. In another embodiment, the current detection circuitry operates to provide the detection signal based on a voltage across a bond wire coupling the source voltage to a lead on a semiconductor die including the power control circuitry. In yet another embodiment, the current detection circuitry is a current mirror circuit that operates to provide the detection signal based on mirroring a current across a series pass element with the power control circuitry, where the series pass element may be a P-type field effect transistor (PFET) device.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 1:
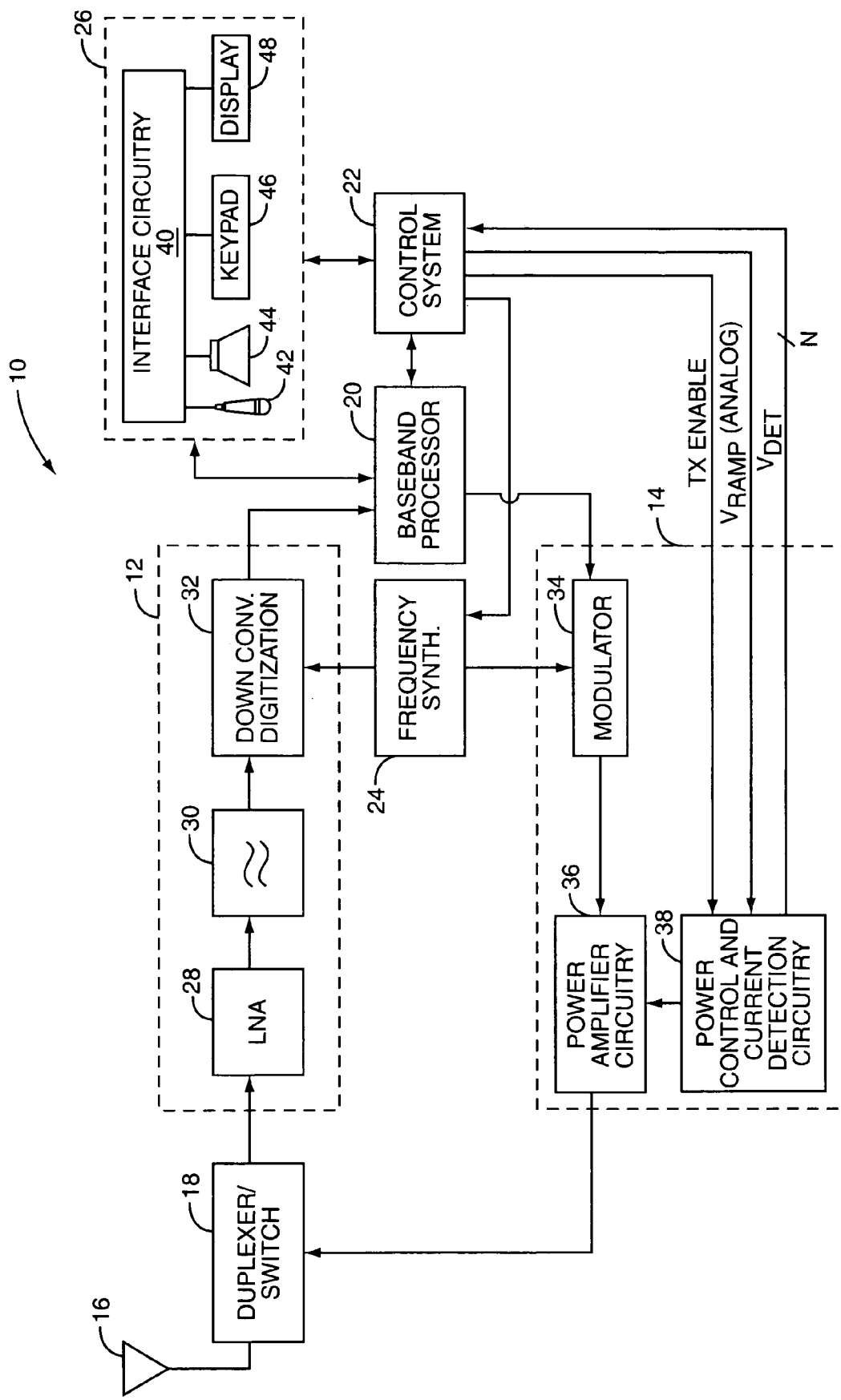
FIG. 1 illustrates a mobile terminal having power control and current detection circuitry according to one embodiment of the present invention.
Figure 5:
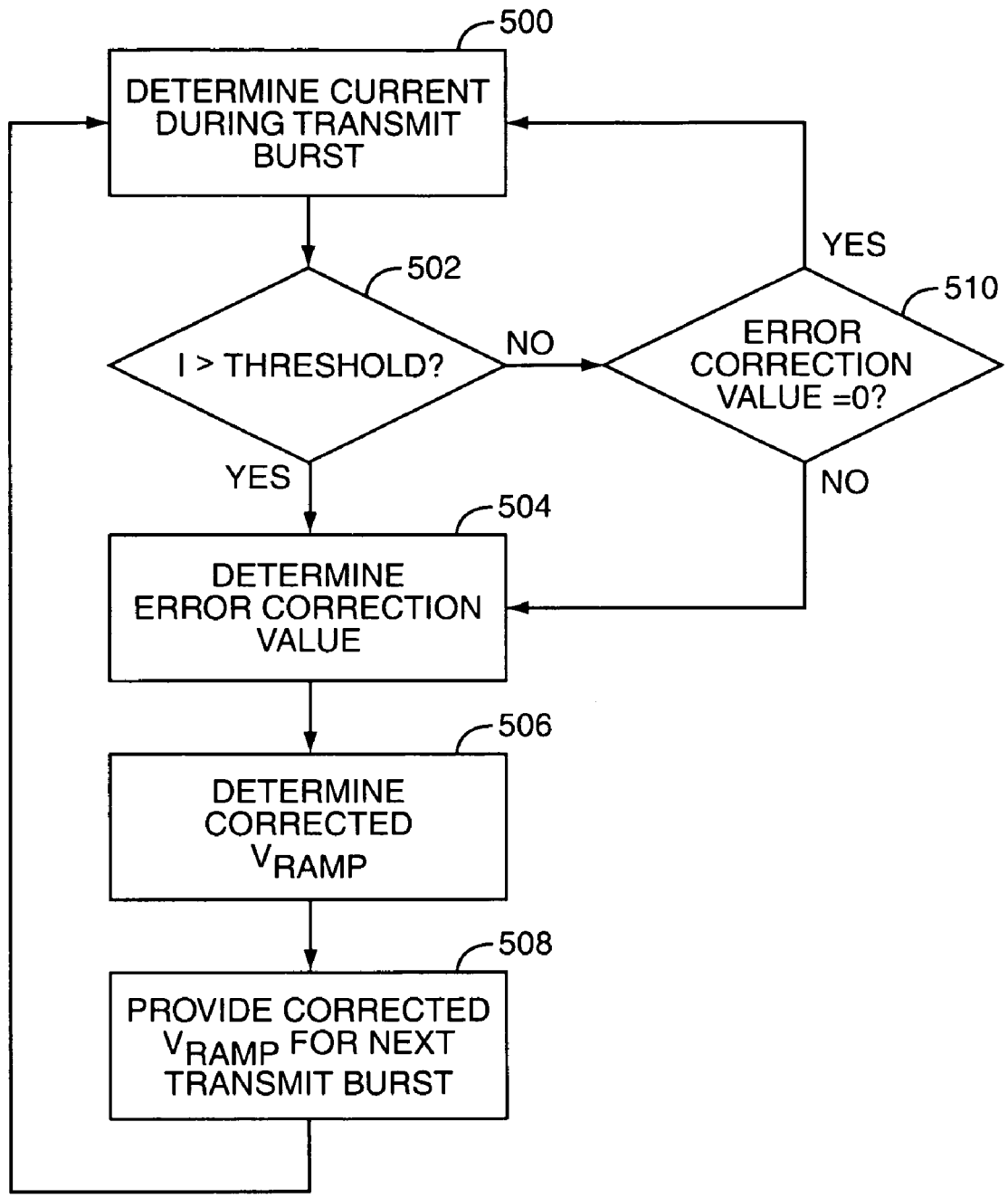
Figure 6:
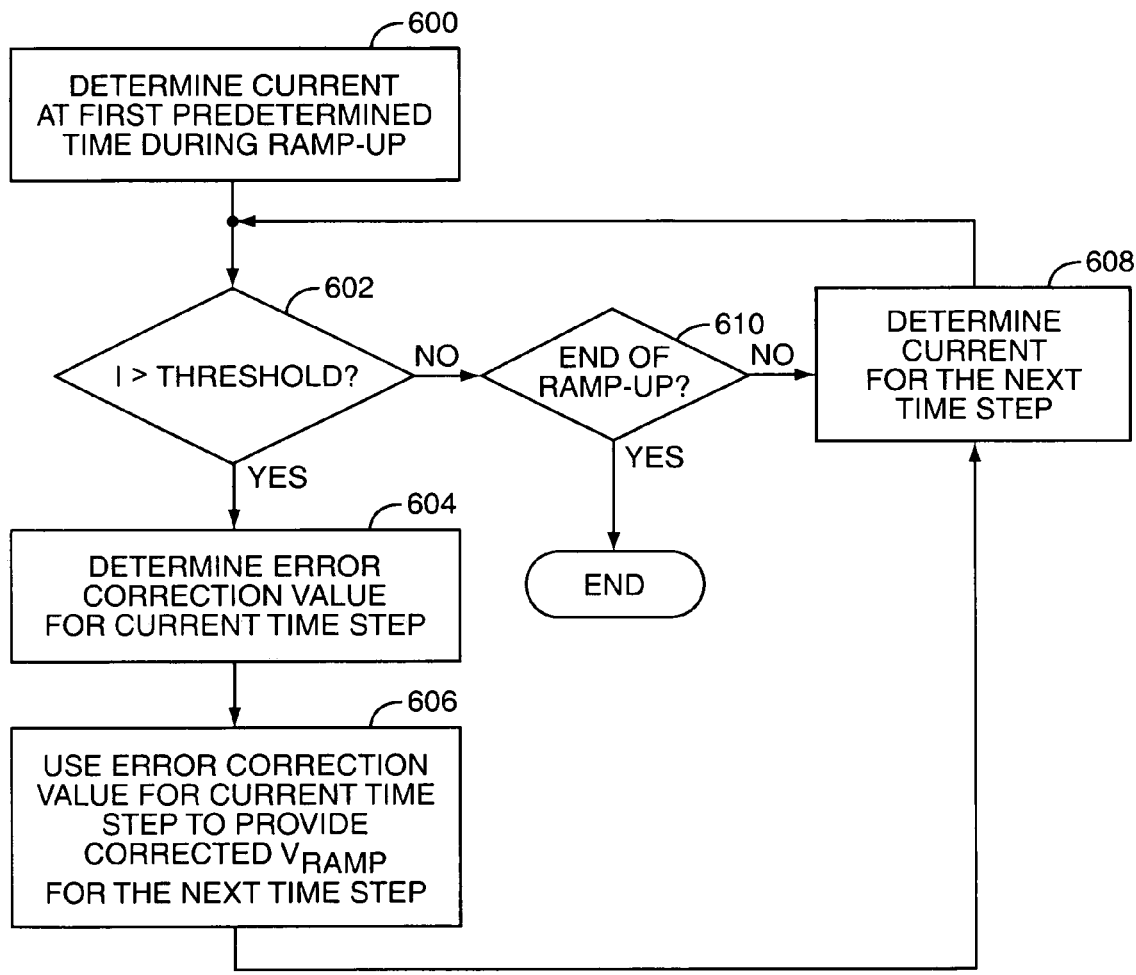

FIG. 5 is a flow chart illustrating a current limiting scheme for limiting current in the power amplifier circuitry of the mobile terminal of FIG. 1 according to one embodiment of the present invention; and FIG. 6 illustrates an exemplary method for determining error correction values for limiting the current of the power amplifier circuitry for a power level in real-time during ramp-up for a transmit burst according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

With reference to FIG. 1, the present invention is preferably incorporated in a mobile terminal 10, such a mobile telephone, personal digital assistant, or the like. The basic architecture of the mobile terminal 10 may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission from the antenna 16.

As described in further detail below, the power amplifier circuitry 36 provides gain for the signal to be transmitted under control of the power control and current detection circuitry 38, which is preferably controlled by the control system 22 using an adjustable power control signal ($V_{RAMP}$). Preferably, the bias for the power amplifier circuitry 36 is relatively stable regardless of power, and varying the voltage supplied to the power amplifier circuitry 36 controls actual power levels. The control system 22 may also provide a transmit enable signal (TX ENABLE) to effectively turn the power amplifier circuitry 36 and power control and current detection circuitry 38 on during periods of transmission. Further, according to the present invention, the power control and current detection circuitry 38 provides a detection signal ($V_{DET}$) to the control system 22 that is indicative of a current through an output stage of the power amplifier circuitry 36. It should be noted that the detection signal ($V_{DET}$) is described herein as a voltage detection signal. Alternatively, the detection signal ($V_{DET}$) may be a current signal detection signal.

A user interacts with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the I/O and interface circuitry 40. The keypad 46 and display 48 enable the user to interact with the mobile terminal 10, input numbers to be dialed, add or view address book information, or the like, as well as monitor call progress information.

Figure 2:
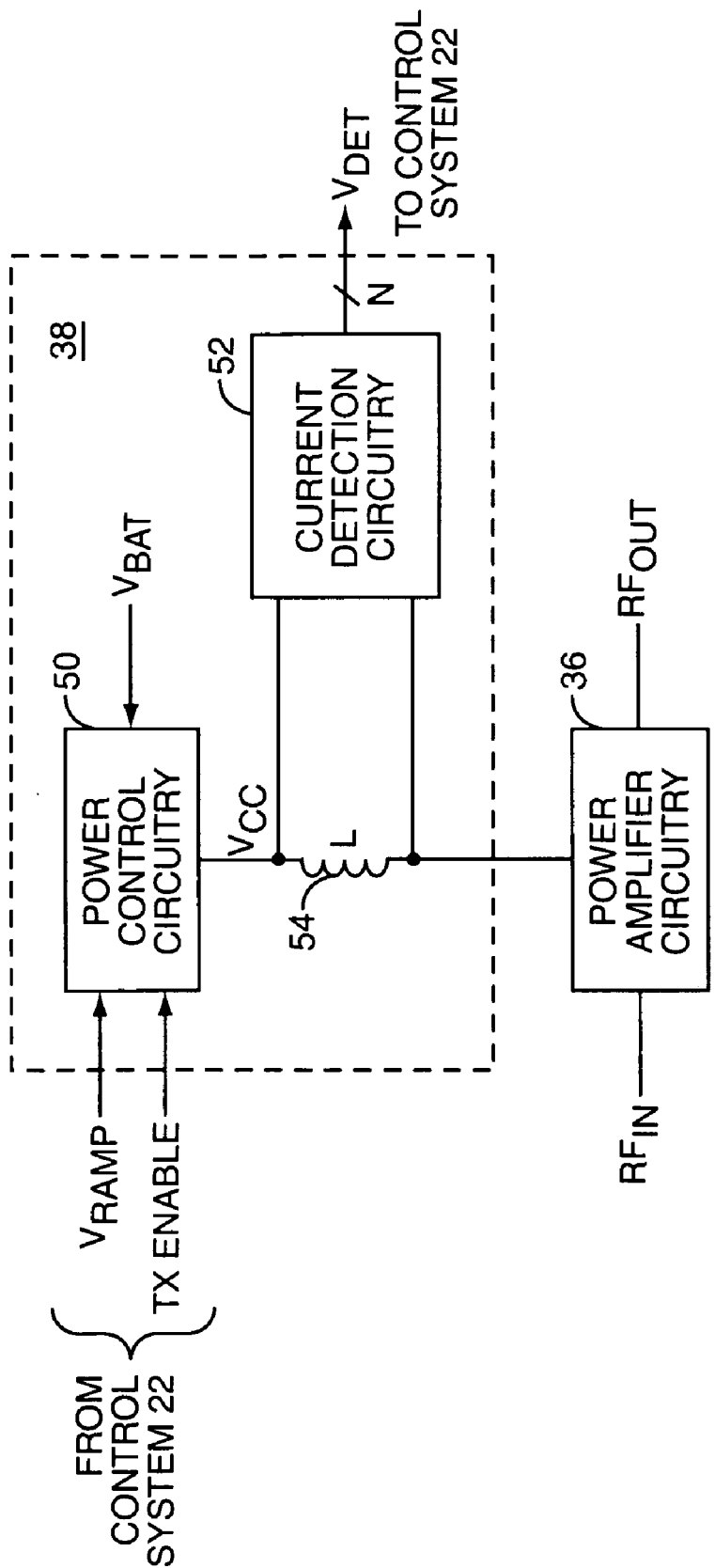
FIG. 2 illustrates the current detection circuitry for detecting the current in power amplifier circuitry based on sensing a voltage across a feed inductor between the power control circuitry and the power amplifier circuitry according to one embodiment of the present invention.

Turning now to FIG. 2, the power amplifier circuitry 36 is associated with the power control and current detection circuitry 38. According to one embodiment of the present invention, the power control and current detection circuitry 38 includes power control circuitry 50, current detection circuitry 52, and an inductor 54. The power control circuitry 50 operates to provide a supply voltage ($V_{CC}$) based on a source voltage ($V_{BAT}$), the adjustable power control signal ($V_{RAMP}$), and a transmitter control signal (TX ENABLE). The current detection circuitry 52 operates to measure a voltage across the inductor 54, which is indicative of a current in the power amplifier circuitry 36, and generate the detection signal ($V_{DET}$) based on the voltage across the inductor 54. The inductor 54 also operates as a DC feed inductor that allows only DC current to flow between the power control circuitry 50 and power amplifier circuitry 36. The inductor 54 is preferably configured to ensure that essentially no radio frequency components are coupled between the power amplifier circuitry 36 and the power control circuitry 50. Further, the inductor 54 has an inductance L and a small inherent resistance. The inductance L is selected such that only the supply voltage $V_{CC}$, which is a DC voltage, is coupled between the power amplifier circuitry 36 and the power control circuitry 50.

As indicated, the current in the power amplifier circuitry 36 is based on the voltage across the inductor 54, which is a desirable component that improves the performance of the power amplifier circuitry 36. Accordingly, the present invention avoids the need to place additional, undesirable resistive components between the source voltage ($V_{BAT}$) and the power amplifier circuitry 36. Further, by avoiding the need for additional resistive components between the source voltage ($V_{BAT}$) and the power amplifier circuitry 36, the present invention also avoids reducing the overall efficiency of the power amplifier circuitry 36 due to the additional resistive components.

Figure 3A:
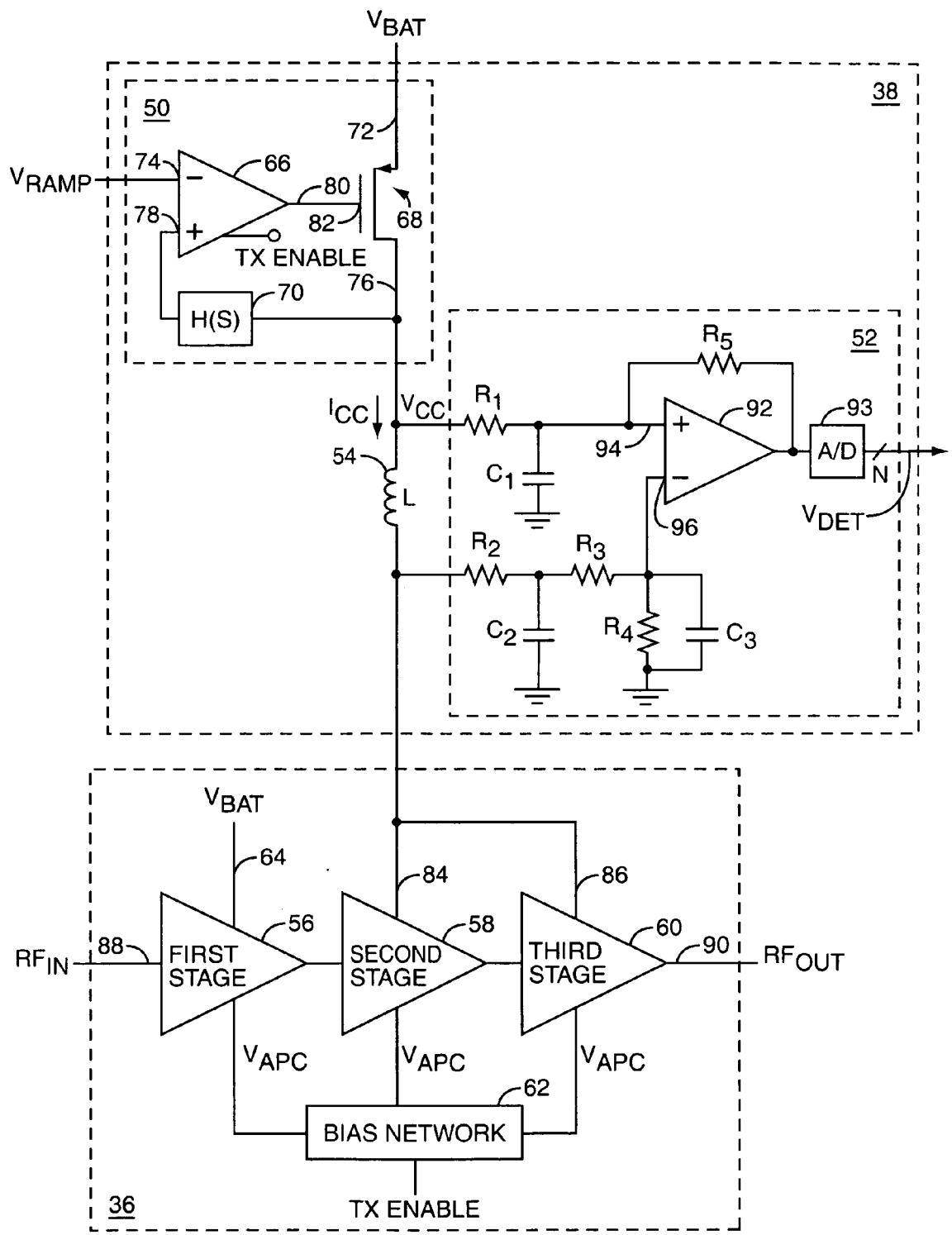
FIG. 3A is a detailed illustration of one embodiment of the power amplifier circuitry, the power control circuitry, and the current detection circuitry of FIG. 2.

FIG. 3A is a more detailed illustration of one embodiment of the power amplifier circuitry 36, the power control circuitry 50, and the current detection circuitry 52. In this embodiment, the power amplifier circuitry 36 includes three amplifier stages, a first amplifier stage 56, a second amplifier stage 58, and a third amplifier stage 60, as well as a bias network 62 providing bias for each of the three amplifier stages 56, 58, and 60.

The rail 64 of first amplifier stage 56 is connected directly to a fixed voltage such as the source voltage ($V_{BAT}$). The source voltage ($V_{BAT}$) may be a voltage supplied by the positive potential of a battery. As noted, the bias network 62 preferably supplies a fixed bias to the three power amplifier stages 56, 58, 60, regardless of the collector/drain voltage supplied to the second and third amplifier stages 58, 60. The fixed bias incorporates traditional VAPC signals, which are configured to maintain a constant bias.

The power control circuitry 50 includes an error amplifier 66, a voltage regulator 68, and a feedback network 70. In the illustrated embodiment, the voltage regulator 68 is a PFET transistor. However, other embodiments of the voltage regulator 68 will be apparent to one of ordinary skill in the art. An input terminal 72 of the voltage regulator is connected to the source voltage ($V_{BAT}$). The adjustable power control signal ($V_{RAMP}$) is received by a negative input 74 of an operational amplifier forming the error amplifier 66. The output 76 of the voltage regulator 68 is fed back through the feedback network 70 and received by positive input 78 of the error amplifier 66. An output signal 80 from the error amplifier 66 is provided to a control input 82 of the voltage regulator 68 that controls the supply voltage ($V_{CC}$) at the regulated output 76 of voltage regulator 68. The voltage regulator 68 regulates the supply voltage ($V_{CC}$) supplied to the rails 84, 86 of the second and third amplifier stages 58, 60, respectively. These rails 84, 86 will typically be the collectors or drains of bipolar or field effect transistors forming the respective amplifier stages, as will be appreciated by those skilled in the art.

The transmitter control signal (TX ENABLE) is a logic signal used to simultaneously enable or disable the power control circuitry 50 by disabling the error amplifier 66 and the power amplifier circuitry 36 by removing the bias from each of the three amplifier stages 56, 58, 60. A radio frequency signal to be amplified ($RF_{IN}$) is provided at the input 88 of the first stage amplifier 56 and amplified by the three amplifier stages 56, 58, 60 to provide an amplified output signal 90 ($RF_{OUT}$) from the third amplifier stage 60.

According to one embodiment of the present invention, the current detection circuitry 52 operates to generate the detection signal ($V_{DET}$) based on the voltage across the inductor 54. In this embodiment, the current detection circuitry 52 includes a differential amplifier 92 and an analog-to-digital (A/D) converter 93. It should be noted that the A/D converter 93 is an optional component and that the detection signal ($V_{DET}$) may be provided to the control system 22 as an analog signal. In this embodiment, the differential amplifier 92 is an operational amplifier. A positive terminal 94 of the differential amplifier 92 is coupled to an input terminal of the inductor 54 via resistor R1. A negative terminal 96 of the differential amplifier 92 is coupled to an output terminal of the inductor 54 via resistors R2 and R3. The resistor R1 and capacitor C1 form a low pass filter that operates to filter any high frequency components from the voltage at the input terminal of the inductor 54 such that only the DC component of the voltage is provided to the positive terminal 94. The resistor R2 and capacitor C2 form another low pass filter that operates to filter any high frequency components from the voltage at the output terminal of the inductor 54 such that only the DC component of the voltage is provided to the negative terminal 96. The resistor R3 and resistor R4 along with capacitor C3 provide additional low-pass filtering of the voltage from the output terminal of the inductor 54. Resistor R5 is selected such that the differential amplifier 92 provides a desired gain.

In operation, the power control circuitry 50 provides the supply voltage ($V_{CC}$) based on the adjustable power control signal ($V_{RAMP}$) and the source voltage ($V_{BAT}$). The supply voltage generates a current ($I_{CC}$) through the inductor 54. Since the inductor 54 includes a small amount of inherent resistance, a voltage drop occurs across the inductor 54. Based on the voltage across the inductor 54, the differential amplifier 92 generates the detection signal ($V_{DET}$), which is indicative of the current $I_{CC}$ in the second and third amplifier stages 58, 60 of the power amplifier circuitry 36. More specifically, the differential amplifier 92 amplifies the voltage across the inductor 54 to provide the detection signal ($V_{DET}$).

Figure 3B:
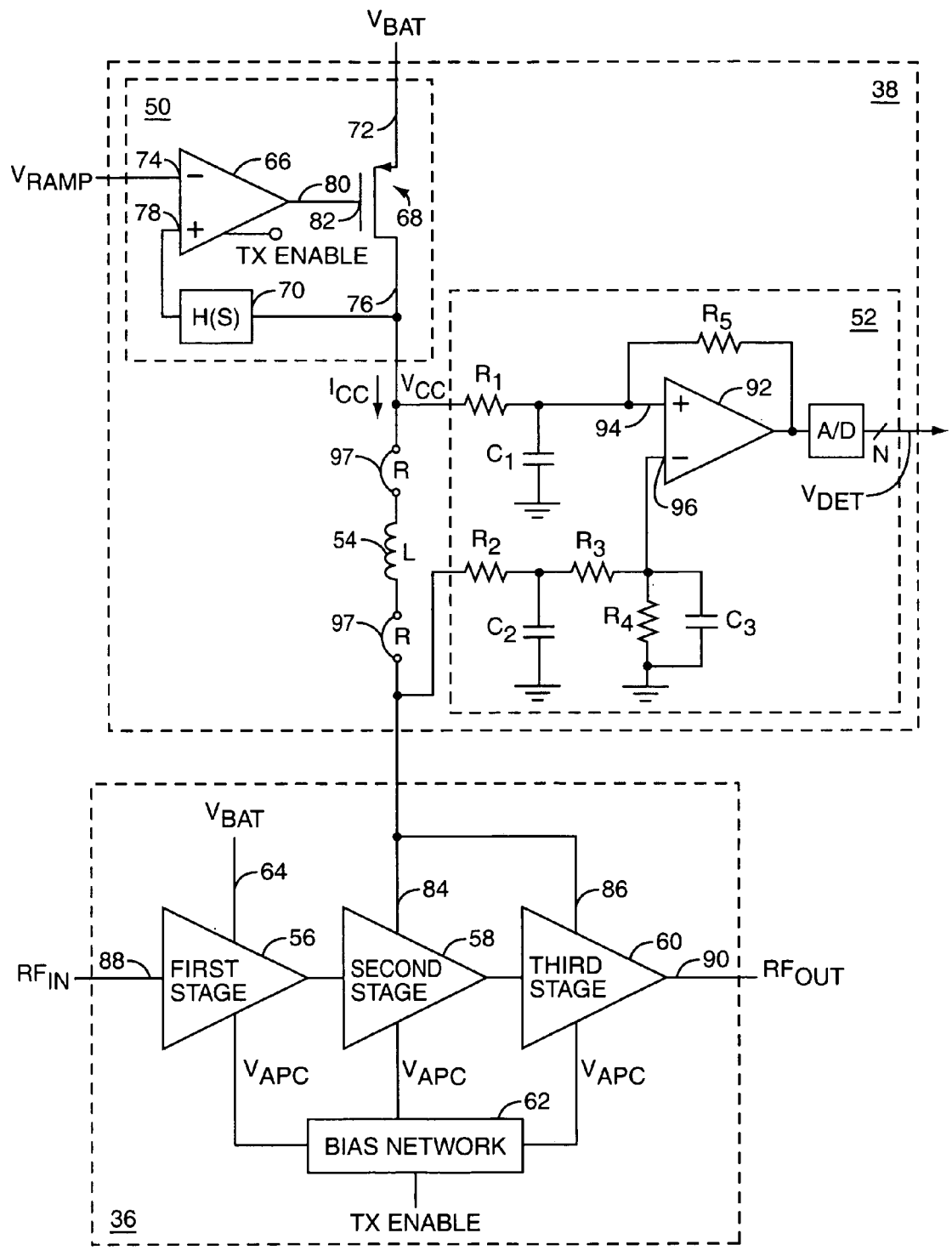
FIG. 3B is a detailed illustration of another embodiment of the power amplifier circuitry, the power control circuitry, and the current detection circuitry of FIG. 3A.

It should also be noted that when fabricating the power control and current detection circuitry 38 and the power amplifier circuitry 36, the inductor 54 may be external to both the power control and current detection circuitry 38 and the power amplifier circuitry 36. Accordingly, as illustrated in FIG. 3B, bond wires 97 may be used to couple the inductor 54 to the power control and current detection circuitry 38 and the power amplifier circuitry 36. Thus, in one embodiment of the present invention, the current detection circuitry 52 may alternatively measure the voltage across the two bond wires 97 and the inductor 54.

Figure 4:
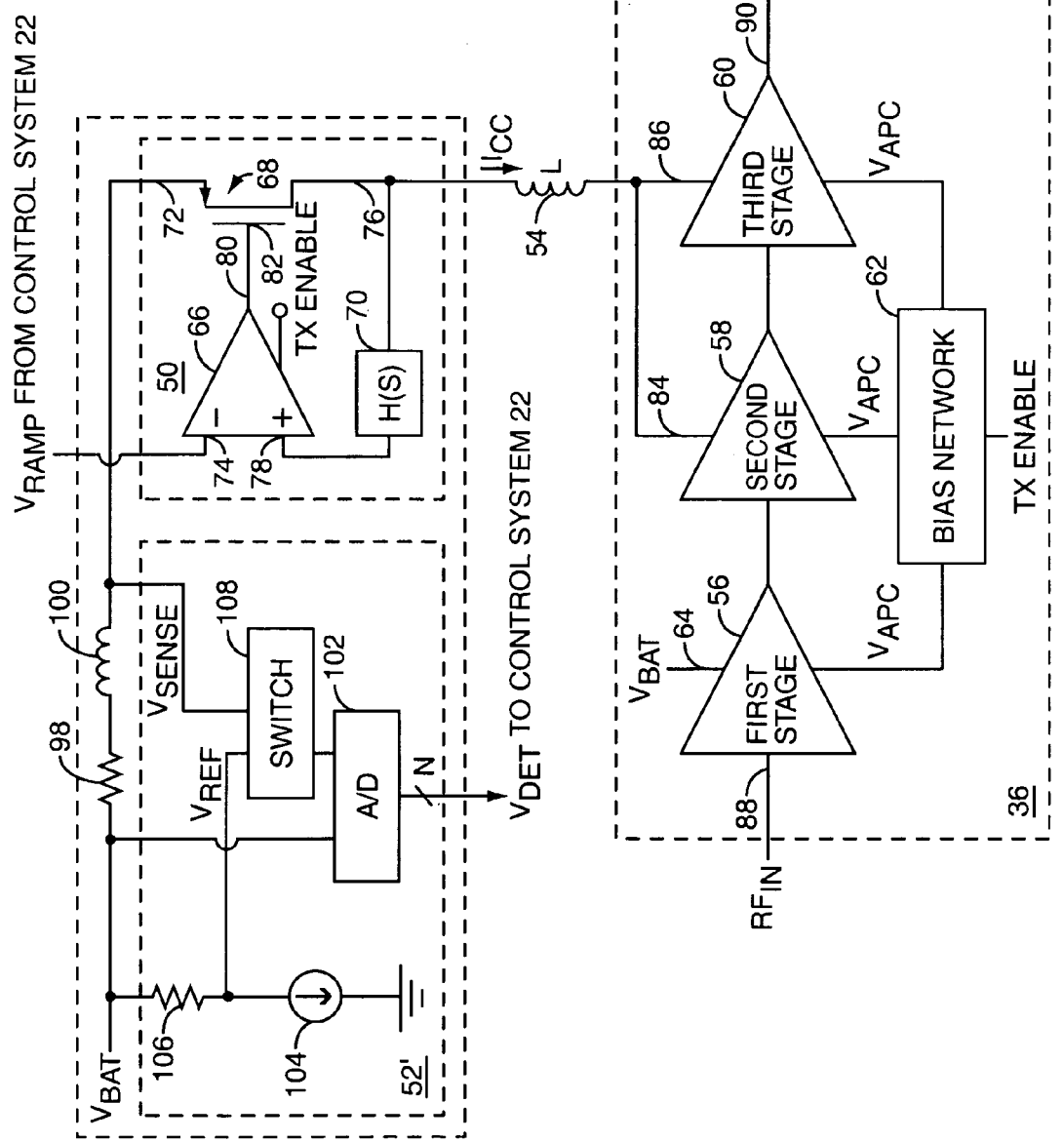
FIG. 4 is another embodiment of the power amplifier circuitry, the power control circuitry, and the current detection circuitry according to the present invention.

FIG. 4 illustrates the power control and current detection circuitry 38 according to another embodiment of the present invention. In this embodiment, the power control and current detection circuitry 38 includes the power amplifier circuitry 36 and the power control circuitry 50 operating as described above and another embodiment of the current detection circuitry 52'. As described with respect to FIGS. 3A and 3B, in one embodiment, the power amplifier circuitry 36 includes the first amplifier stage 56, the second amplifier stage 58, and the third amplifier stage 60, as well as the bias network 62 for providing bias for each of the three amplifier stages 56, 58, and 60.

The power control circuitry 50 includes the error amplifier 66, the voltage regulator 68, and the feedback network 70. In operation, the voltage regulator 68 regulates the supply voltage ($V_{CC}$) supplied to the rails 84, 86 of the second and third amplifier stages 58, 60, respectively, based on the source voltage ($V_{BAT}$) and the adjustable power control signal (VAMP). The rails 84, 86 will typically be the collectors or drains of bipolar or field effect transistors forming the respective amplifier stages, as will be appreciated by those skilled in the art.

The transmitter control signal (TX ENABLE) is a logic signal used to enable or disable the power amplifier circuitry 36 and the power control circuitry 50, as described above. The radio frequency signal to be amplified ($RF_{IN}$) is provided at the input 88 of the first stage amplifier 56 and amplified by the three amplifier stages 56, 58, 60 to provide the amplified output signal 90 ($RF_{OUT}$) from the third amplifier stage 60.

The current detection circuitry 52' operates to generate the detection signal ($V_{DET}$) based on a voltage across a resistor 98 and an inductor 100 coupled between the source voltage ($V_{BAT}$) and the voltage regulator 68. The voltage across the resistor 98 and the inductor 100 is indicative of the current in the second and third amplifier stages 58, 60 of the power amplifier circuitry 36. In one embodiment, the resistor 98 and the inductor 100 represent a resistance and inductance of a bond wire used to connect a positive terminal of a battery providing the source voltage ($V_{BAT}$) to a lead on a semiconductor die including the power control circuitry 50. In another embodiment, the resistor 98 and the inductor 100 are elements placed between the positive terminal of a battery providing the source voltage ($V_{BAT}$) and the voltage regulator 68.

As illustrated, the current detection circuitry 52' includes an analog-to-digital (A/D) converter 102, a reference current source 104, a reference resistor 106, and switching circuitry 108. In general, the A/D converter 102 is a differential A/D converter and operates to measure, or digitize, the voltage across the resistor 98 and the inductor 100. In the embodiment where the resistor 98 and the inductor 100 are the resistance and inductance of a bond wire, the resistance is typically 10-20 mΩ. In other embodiments, the resistance of the resistor 98 is desirably small to reduce losses. Thus, for a one or two ampere current, the voltage across the resistor 98 may be in the range of 10-40 mV.

In order to accurately measure small voltages across the resistor 98 and the inductor 100, it may be desirable to calibrate the A/D converter 102 using a reference voltage ($V_{REF}$) to compensate for offset and gain drifts. In this embodiment, the reference voltage ($V_{REF}$) is generated by the reference current source 104 and the reference resistor 106. In one embodiment, the A/D converter 102 operates to perform self-calibration based on the reference voltage ($V_{REF}$). In another embodiment, calibration is performed by digitizing the reference voltage ($V_{REF}$) and providing the digitized reference voltage ($V_{REF}$) to the control system 22 (FIG. 1). The control system 22 then operates to calculate a correction value based on the actual digitized reference voltage ($V_{REF}$) and an ideal value of the digitized reference voltage ($V_{REF}$). Thereafter, the control system 22 uses the correction value to correct the output of the A/D converter 102.

The switching circuitry 108 operates to provide the reference voltage ($V_{REF}$) or a sense voltage ($V_{SENSE}$) to the A/D converter 102. During calibration, the switching circuitry 108 provides the reference voltage ($V_{REF}$) to the A/D converter 102. When it is desirable to measure the current through the resistor 98 and inductor 100, the switching circuitry 108 provides the sense voltage ($V_{SENSE}$) to the A/D converter 102. The operation of the switching circuitry 108 may be controlled by the control system 22.

Referring to FIGS. 2, 3A, 3B, and 4, the detection signal ($V_{DET}$) is indicative of the current in the power amplifier circuitry 36. As mention above, the control system 22 (FIG. 1) may use the detection signal ($V_{DET}$) to limit the current in the second and third amplifier stages 58, 60 of the power amplifier circuitry 36 according to one embodiment of the present invention. However, it should be noted that the detection signal ($V_{DET}$) may be used by the control system 22 for various other reasons as will be apparent to one of ordinary skill in the art after reading this disclosure.

FIG. 5 is a flow chart illustrating the operation of the control system 22 (FIG. 1) to limit the current in the second and third amplifier stages 58, 60 of the power amplifier circuitry 36 according to one embodiment of the present invention. Prior to discussing the details of the operation of the control system 22, it may be beneficial to mathematically describe the operation of the control system 22 in limiting the current in the second and third amplifier stages 58, 60 of the power amplifier circuitry 36 based on determining error correction values for each value of the adjustable power control signal ($V_{RAMP}$).

The control system 22 operates to provide the adjustable power control signal ($V_{RAMP}$) such that the signal ($V_{RAMP}$) can have any one of a number of values. Each value of the signal ($V_{RAMP}$) corresponds to one of a number of power levels for the power amplifier circuitry 36. The value of the signal ($V_{RAMP}$) is selected by the control system 22 based on the desired power level of the power amplifier circuitry 36, which corresponds to the output power of the mobile terminal 10. The ideal values of $V_{RAMP}$ ($V_{RAMP,IDEAL}$) for the number of power levels can be described as:

$$V_{RAMP,IDEAL} = \begin{Bmatrix} 1 & 762 \\ 2 & 608 \\ 3 & 494 \\ \vdots & \vdots \\ N & 88 \end{Bmatrix},$$

where the first column defines the number (N) of different power levels for the power amplifier circuitry 36 and the second column gives exemplary 10-bit decimal values of $V_{RAMP,IDEAL}$ corresponding to each power level.

Alternatively, the ideal values of $V_{RAMP}$ ($V_{RAMP,IDEAL}$) may be expressed in matrix form to include ideal values of $V_{RAMP}$ during ramp-up and ramp-down including a peak value. It should be noted that the adjustable power control signal ($V_{RAMP}$) is ramped-up from a minimum value, such as zero, to the peak value for the transmit burst prior to providing data to the power amplifier circuitry 36 for each transmit burst. Similarly, the power control signal ($V_{RAMP}$) is ramped-down from the peak value to the minimum value at the end of each transmit burst. Accordingly, ideal values of $V_{RAMP}$ ($V_{RAMP,IDEAL}$) may alternatively be expressed in matrix form as:

$$V_{RAMP,IDEAL} = \begin{Bmatrix} 1 & \eta_1(0) & \eta_1(1) & \eta_1(2) & \ldots & 762 \\ 2 & \eta_2(0) & \eta_2(1) & \eta_2(2) & \ldots & 608 \\ 3 & \eta_3(0) & \eta_3(1) & \eta_3(2) & \ldots & 494 \\ \vdots & \vdots & \vdots & \vdots & \ldots & \vdots \\ N & \eta_N(0) & \eta_N(1) & \eta_N(2) & \ldots & 88 \end{Bmatrix},$$

where the values $\eta_i(0)$, $\eta_i(1)$, $\eta_i(2)$, ... are the ideal values of $V_{RAMP}$ during ramp-up, and, when reversed, are the ideal values of $V_{RAMP}$ during ramp-down. Each of the values $\eta_i(0)$, $\eta_i(1)$, $\eta_i(2)$ corresponds to a time step during ramp-up or, when reversed, ramp-down. The values in the last column of the matrix are the peak values of $V_{RAMP,IDEAL}$ for each of the output power levels.

In either case, the ideal values ($V_{RAMP,IDEAL}$) are the ideal values of $V_{RAMP}$ when the load at the antenna 16 is equal to the ideal load, which may be, for example, 50 ohms. It should be noted that the values of the ideal adjustable power control signal $V_{RAMP,IDEAL}$ corresponding to each power level are determined prior to step 500 of FIG. 5 and for purposes of the present invention are to be considered known values. According to the present invention, error correction values $\epsilon$ are determined for each power level and can be defined as:

$$\varepsilon = \begin{Bmatrix} 0 & 170 \\ 0 & 28 \\ 0 & 0 \\ \vdots & \vdots \\ 0 & 0 \end{Bmatrix},$$

where the second column defines exemplary decimal values for the error correction values corresponding to each power level. Alternatively, where the ideal values of $V_{RAMP}$ include values during ramp-up and ramp-down, there may be a set of error correction values for each power level, and the error correction values $\varepsilon$ can be defined as:

$$\varepsilon = \begin{Bmatrix} 0 & \varepsilon_{1,1} & \varepsilon_{1,2} & \varepsilon_{1,3} & \ldots & 170 \\ 0 & \varepsilon_{2,1} & \varepsilon_{2,2} & \varepsilon_{2,3} & \ldots & 28 \\ 0 & \varepsilon_{3,1} & \varepsilon_{3,2} & \varepsilon_{3,3} & \ldots & 0 \\ \vdots & \vdots & \vdots & \vdots & \ldots & \vdots \\ 0 & \varepsilon_{N,1} & \varepsilon_{N,2} & \varepsilon_{N,3} & \ldots & 0 \end{Bmatrix},$$

where each row corresponds to a set of error correction values for a particular power level. Each of the error correction values corresponds to one of the ideal values for $V_{RAMP}$ above.

As described below in more detail, the adjustable power control signal $V_{RAMP}$ is a corrected version of the ideal adjustable power control signal $V_{RAMP,IDEAL}$ and is determined based on the ideal adjustable power control signal $V_{RAMP,IDEAL}$ and the error correction values $\varepsilon$. Thus, in this example, the adjustable power control signal $V_{RAMP}$ is defined as:

$$V_{RAMP} = V_{RAMP,IDEAL} - \varepsilon.$$

Thus, when $V_{RAMP,IDEAL}$ includes only the peak value for each power level, the adjustable power control signal $V_{RAMP}$ is defined as:

$$V_{RAMP} = \begin{Bmatrix} 1 & 762 \\ 2 & 608 \\ 3 & 494 \\ \vdots & \vdots \\ N & 88 \end{Bmatrix} - \begin{Bmatrix} 0 & 170 \\ 0 & 28 \\ 0 & 0 \\ \vdots & \vdots \\ 0 & 0 \end{Bmatrix} = \begin{Bmatrix} 1 & 592 \\ 2 & 580 \\ 3 & 494 \\ \vdots & \vdots \\ N & 88 \end{Bmatrix}.$$

Alternatively, when $V_{RAMP,IDEAL}$ includes values for ramp-up/ramp-down including the peak value for each power level, the adjustable power control signal $V_{RAMP}$ is defined as:

$$V_{RAMP} = \begin{Bmatrix} 1 & \eta_1(0) & \eta_1(1) & \eta_1(2) & \ldots & 762 \\ 2 & \eta_2(0) & \eta_2(1) & \eta_2(2) & \ldots & 608 \\ 3 & \eta_3(0) & \eta_3(1) & \eta_3(2) & \ldots & 494 \\ \vdots & \vdots & \vdots & \vdots & \ldots & \vdots \\ N & \eta_N(0) & \eta_N(1) & \eta_N(2) & \ldots & 88 \end{Bmatrix} -$$

-continued $$\begin{Bmatrix} 0 & \varepsilon_{1,1} & \varepsilon_{1,2} & \varepsilon_{1,3} & \ldots & 170 \\ 0 & \varepsilon_{2,1} & \varepsilon_{2,2} & \varepsilon_{2,3} & \ldots & 28 \\ 0 & \varepsilon_{3,1} & \varepsilon_{3,2} & \varepsilon_{3,3} & \ldots & 0 \\ \vdots & \vdots & \vdots & \vdots & \ldots & \vdots \\ 0 & \varepsilon_{N,1} & \varepsilon_{N,2} & \varepsilon_{N,3} & \ldots & 0 \end{Bmatrix}$$

$$V_{RAMP} = \begin{Bmatrix} 1 & \eta_1(0)-\varepsilon_{1,1} & \eta_1(1)-\varepsilon_{1,2} & \eta_1(2)-\varepsilon_{1,3} & \ldots & 592 \\ 2 & \eta_2(0)-\varepsilon_{2,1} & \eta_2(1)-\varepsilon_{2,2} & \eta_2(2)-\varepsilon_{2,3} & \ldots & 580 \\ 3 & \eta_3(0)-\varepsilon_{3,1} & \eta_3(1)-\varepsilon_{3,2} & \eta_3(2)-\varepsilon_{3,2} & \ldots & 494 \\ \vdots & \vdots & \vdots & \vdots & \ldots & \vdots \\ N & \eta_N(0)-\varepsilon_{N,1} & \eta_N(1)-\varepsilon_{N,2} & \eta_N(2)-\varepsilon_{N,3} & \ldots & 88 \end{Bmatrix}$$

$$\begin{Bmatrix} 1 & 592 \\ 2 & 580 \\ 3 & 494 \\ \vdots & \vdots \\ N & 88 \end{Bmatrix}.$$

Returning to FIG. 5, the control system 22 operates to receive the signal ($V_{DET}$) indicative of the current in the second and third amplifier stages 58, 60 of the power amplifier circuitry 36 for a particular value of the adjustable power control signal (VAMP). During a transmission burst by the mobile terminal 10, the control system 22 determines the current in the second and third amplifier stages 58, 60 of the power amplifier circuitry 36 via the signal ($V_{DET}$) (step 500). The control system 22 determines the current in the second and third amplifier stages 58, 60 of the power amplifier circuitry 36 based on the detection signal ($V_{DET}$) and known values of the inductor 54, the inductor 54 and bond wires 97, or the resistor 98 and inductor 100 depending on the embodiment of the current detection circuitry 52 or 52'.

If the mobile terminal 10 is operating in a mode where the power amplifier circuitry 36 operates to control the output power of the mobile terminal 10, such as when the mobile terminal 10 is operating according to the GSM standard, the current is determined based on the signal ($V_{DET}$) generated by the current detection circuitry 52 or 52' at essentially any point during the transmit burst. Also, if the power amplifier circuitry 36 operates to provide amplitude modulation, such as when the mobile terminal 10 is operating according to the EDGE standard, the current may be determined based on the signal ($V_{DET}$) generated by the current detection circuitry 52 or 52' at any point during the transmit burst using a known relationship between the output power and the adjustable power control signal ($V_{RAMP}$). Alternatively, the current may be determined based on the signal ($V_{DET}$) generated by the current detection circuitry 52 or 52' at a point during the transmit burst when it is known that the amplitude modulation is essentially zero. As another alternative, the current may be determined at numerous points during the transmit burst and time averaged to provide an average current.

If the current (I) in the second and third amplifier stages 58, 60 of the power amplifier circuitry 36 exceeds a predetermined threshold (step 502), the control system 22 determines the error correction value $\varepsilon$ (step 504) for the corresponding value of the signal ($V_{RAMP}$), and thus the corresponding power level and, optionally, time step during ramp-up or ramp-down, based on a difference between the sampled current and the predetermined current threshold. More specifically, the current in the second and third amplifier stages 58, 60 of the power amplifier circuitry 36 is defined by the current versus adjustable power control signal characteristic:

$$I(t) = aV_{RAMP,IDEAL}(t) + K,$$

where "a" is a known value that is essentially equal to a change in the current I with respect to a change in the ideal adjustable power control signal $V_{RAMP,IDEAL}$ when the load at the antenna 16 is at its ideal value. Thus, the term "a" is the slope, or derivative, of the current versus adjustable power control signal characteristic. K is a constant essentially equal to the current I when $V_{RAMP,IDEAL}$ is zero.

The error correction value $\epsilon$ for the particular value of $V_{RAMP}$ is defined as:

$$\epsilon = \epsilon_{PREV} + \epsilon_{CURRENT}, \text{ where}$$

$$\epsilon_{CURRENT} = (I - I_{THRESHOLD})/a, \text{ such that}$$

$$\epsilon = \epsilon_{PREV} + (I - I_{THRESHOLD})/a,$$

where $\epsilon_{PREV}$ is a previous value of the error correction value for the particular value of $V_{RAMP}$ and $I_{THRESHOLD}$ is the predetermined threshold value. It should be noted that when the load at the antenna is not equal to its ideal value, the actual value of a, or the change in the current per change in the signal $V_{RAMP}$, may be different than its ideal value used to calculate the error correction value $\epsilon$. Accordingly, more than one iteration of the method of FIG. 5 may be required to determine an optimum error correction value $\epsilon$.

Based on the error correction value $\epsilon$ and the ideal value $V_{RAMP,IDEAL}$, the corrected adjustable power control signal ($V_{RAMP}$) is determined prior to the next transmission by the mobile terminal 10 (step 506). As described above, the signal $V_{RAMP}$ is determined based on subtracting the error correction value $\epsilon$ from the corresponding value of $V_{RAMP,IDEAL}$. The corrected adjustable power control signal ($V_{RAMP}$) is a value of the signal $V_{RAMP}$ that would have limited the current in the second and third amplifier stages 58, 60 of the power amplifier circuitry 36 to the predetermined threshold in the transmission burst of step 500. The corrected $V_{RAMP}$ value is provided to the power control circuitry 50 during the next transmission burst at the corresponding power level (step 508).

It should be noted that where there is a set of error correction values for each power level, step 500 may occur during ramp-up, ramp-down, or any other point during the transmit burst. Then, step 504 may determine each of the set of error correction values for the power level based on the detection signal ($V_{DET}$) and the threshold value, where there may be different threshold values for each time step during ramp-up and ramp-down. Similarly, step 506 determines corrected values for $V_{RAMP}$ for ramp-up, ramp-down, and the peak value of $V_{RAMP}$ for the power level, and step 508 provides the corrected values of $V_{RAMP}$ for the next transmit burst.

If the current in the second and third amplifier stages 58, 60 of the power amplifier circuitry 36 does not exceed the predetermined threshold value (step 502), and a current error correction value for the corresponding value of $V_{RAMP}$ is zero (step 510), then steps 504 and 508 may be skipped, and the control system may return to step 500. If the current in the second and third amplifier stages 58, 60 of the power amplifier circuitry 36 does not exceed the predetermined threshold value (step 502), and a current error correction value for the corresponding value of $V_{RAMP}$ is not equal to zero (step 510), then the control system 22 proceeds to step 504. The process is repeated for each transmit burst by the mobile terminal 10.

As an example, assume that the power amplifier circuitry 36 has 5 power levels and the ideal adjustable power control signal $V_{RAMP,IDEAL}$ for each of the power levels is:

$$V_{RAMP,IDEAL} = \begin{Bmatrix} 1 & 762 \\ 2 & 608 \\ 3 & 494 \\ 4 & 409 \\ 5 & 336 \end{Bmatrix}.$$

Further assume that the current error correction values are:

$$\varepsilon = \begin{Bmatrix} 0 & 170 \\ 0 & 0 \\ 0 & 0 \\ 0 & 0 \\ 0 & 0 \end{Bmatrix}.$$

If a transmit burst occurs at power level 2, the adjustable power control signal $V_{RAMP}$ during the transmit burst has the decimal value 608. The current detection circuitry 52 or 52' provides the signal $V_{DET}$ that is indicative of the current in the second and third amplifier stages 58, 60 of the power amplifier circuitry 36. The control system 22 determines the current in the second and third amplifier stages 58, 60 based on the signal $V_{DET}$. Now assume that a=1.25, the current detected is 2 A, and the predetermined threshold is 1.8 A. According to the equation given above, the error correction value for the signal ($V_{RAMP}$) at power level 2 is:

$$\epsilon = \epsilon_{PREV} + (I - I_{THRESHOLD})/a = 0 + (2 - 1.8)/1.25 = 160 \text{ mV}.$$

Using the equation:

$$\text{decimal\_value} = \frac{value * 2^B}{threshold\_value},$$

where B is the bit resolution of the A/D converter 102 (FIG. 4), the error correction value of 160 mV has a decimal value of 91 for 10-bit resolution. Accordingly, the new error correction values are:

$$\varepsilon = \begin{Bmatrix} 0 & 170 \\ 0 & 91 \\ 0 & 0 \\ 0 & 0 \\ 0 & 0 \end{Bmatrix},$$

and the corrected adjustable power control signal $V_{RAMP}$ is:

$$V_{RAMP} = \begin{Bmatrix} 1 & 592 \\ 2 & 517 \\ 3 & 494 \\ 4 & 409 \\ 5 & 336 \end{Bmatrix}.$$

Thus, the next time a transmit burst occurs at power level 2, the adjustable power control signal $V_{RAMP}$ will have a decimal value of 517 rather than 608, thereby reducing the current in the second and third amplifier stages 58, 60 of the power amplifier circuitry 36 to essentially the predefined threshold value of 1.8 A.

Now assume that a transmit burst occurs at power level 1, which corresponds to $V_{RAMP}$ having the decimal value 592. The current detection circuitry 52 or 52' provides the signal $V_{DET}$ that is indicative of the current in the second and third amplifier stages 58, 60 of the power amplifier circuitry 36. The control system 22 determines the current in the second and third amplifier stages 58, 60 based on the signal $V_{DET}$. Now assume that a=1.25, the current is 1.7 A, and the predetermined threshold is 1.8 A, where the reduced current is due to a change in the load at the antenna 16. According to the equation given above, the error correction value for $V_{RAMP}$ at power level 1 is:

$$\epsilon = \epsilon_{PREV} + (I - I_{THRESHOLD})/a = 0.299 + (1.7-1.8)/1.25 = 219 \text{ mV}$$

which has a decimal value of 125 using 10-bit resolution. The $\epsilon_{PREV}$ value of 0.299 is the base-10 value corresponding to the decimal value 592. Accordingly, the new error correction values are:

$$\varepsilon = \begin{Bmatrix} 0 & 125 \\ 0 & 91 \\ 0 & 0 \\ 0 & 0 \\ 0 & 0 \end{Bmatrix},$$

and the corrected adjustable power control signal $V_{RAMP}$ is:

$$V_{RAMP} = \begin{Bmatrix} 1 & 637 \\ 2 & 517 \\ 3 & 494 \\ 4 & 409 \\ 5 & 336 \end{Bmatrix}.$$

Thus, the next time a transmit burst occurs at power level 1, the adjustable power control signal $V_{RAMP}$ will have a decimal value of 637 rather than 592, thereby increasing the current in the second and third amplifier stages 58, 60 of the power amplifier circuitry 36 to essentially the predefined threshold value of 1.8 A. It should be noted that in respect to power level 1, this example has shown the operation of the control system 22 in determining the optimum error correction value $\epsilon$ for power level 1. Thus, the control system 22 operates to provide the optimum error correction value $\epsilon$ for each power level that limits the current in the second and third amplifier stages 58, 60 of the power amplifier circuitry 36 to the predetermined threshold value.

Although the example above determines only one error correction value and one corrected value of $V_{RAMP}$ for each power level, the method may determine the set of error correction values for each power level using a single value of the detection signal ($V_{DET}$) for each power level or multiple values of the detection signal ($V_{DET}$) for each power level.

FIG. 6 illustrates an exemplary method for determining the set of error correction values $\epsilon$ for a power level in real-time during ramp-up of the adjustable power control signal ($V_{RAMP}$) for a transmit burst. Variations of this method will be apparent to one of ordinary skill in the art upon reading this disclosure. As stated above, in one embodiment, $V_{RAMP,IDEAL}$ can be defined as:

$$V_{RAMP,IDEAL} = \begin{Bmatrix} 1 & \eta_1(0) & \eta_1(1) & \eta_1(2) & \dots & 762 \\ 2 & \eta_2(0) & \eta_2(1) & \eta_2(2) & \dots & 608 \\ 3 & \eta_3(0) & \eta_3(1) & \eta_3(2) & \dots & 494 \\ \vdots & \vdots & \vdots & \vdots & \dots & \vdots \\ N & \eta_N(0) & \eta_N(1) & \eta_N(2) & \dots & 88 \end{Bmatrix},$$

where the last column of the matrix is merely exemplary. Also, the error correction values may be defined as:

$$\varepsilon = \begin{Bmatrix} 0 & \varepsilon_{1,1} & \varepsilon_{1,2} & \varepsilon_{1,3} & \dots & 170 \\ 0 & \varepsilon_{2,1} & \varepsilon_{2,2} & \varepsilon_{2,3} & \dots & 28 \\ 0 & \varepsilon_{3,1} & \varepsilon_{3,2} & \varepsilon_{3,3} & \dots & 0 \\ \vdots & \vdots & \vdots & \vdots & \dots & \vdots \\ 0 & \varepsilon_{N,1} & \varepsilon_{N,2} & \varepsilon_{N,3} & \dots & 0 \end{Bmatrix},$$

where again the last column of the matrix is exemplary. As such, the corrected $V_{RAMP}$ may be defined as:

$$V_{RAMP} = \begin{Bmatrix} 1 & \eta_1(0) & \eta_1(1) & \eta_1(2) & \dots & 762 \\ 2 & \eta_2(0) & \eta_2(1) & \eta_2(2) & \dots & 608 \\ 3 & \eta_3(0) & \eta_3(1) & \eta_3(2) & \dots & 494 \\ \vdots & \vdots & \vdots & \vdots & \dots & \vdots \\ N & \eta_N(0) & \eta_N(1) & \eta_N(2) & \dots & 88 \end{Bmatrix} - \begin{Bmatrix} 0 & \varepsilon_{1,1} & \varepsilon_{1,2} & \varepsilon_{1,3} & \dots & 170 \\ 0 & \varepsilon_{2,1} & \varepsilon_{2,2} & \varepsilon_{2,3} & \dots & 28 \\ 0 & \varepsilon_{3,1} & \varepsilon_{3,2} & \varepsilon_{3,3} & \dots & 0 \\ \vdots & \vdots & \vdots & \vdots & \dots & \vdots \\ 0 & \varepsilon_{N,1} & \varepsilon_{N,2} & \varepsilon_{N,3} & \dots & 0 \end{Bmatrix}$$

$$V_{RAMP} = \begin{Bmatrix} 1 & \eta_1(0) - \varepsilon_{1,1} & \eta_1(1) - \varepsilon_{1,2} & \eta_1(2) - \varepsilon_{1,3} & \dots & 592 \\ 2 & \eta_2(0) - \varepsilon_{2,1} & \eta_2(1) - \varepsilon_{2,2} & \eta_2(2) - \varepsilon_{2,3} & \dots & 580 \\ 3 & \eta_3(0) - \varepsilon_{3,1} & \eta_3(1) - \varepsilon_{3,2} & \eta_3(2) - \varepsilon_{3,3} & \dots & 494 \\ \vdots & \vdots & \vdots & \vdots & \dots & \vdots \\ N & \eta_N(0) - \varepsilon_{N,1} & \eta_N(1) - \varepsilon_{N,2} & \eta_N(2) - \varepsilon_{N,3} & \dots & 88 \end{Bmatrix} \begin{Bmatrix} 1 & 592 \\ 2 & 580 \\ 3 & 494 \\ \vdots & \vdots \\ N & 88 \end{Bmatrix}$$

It should be noted that the second column of these matrices is referred to as time step 0 during ramp-up, the third column is referred to as time step 1 during ramp-up, etc.

According to one embodiment of the present invention, the set of error correction values for any particular power level may be determined in real-time during ramp-up for a transmit burst. First, the control system 22 determines the current in the second and third amplifier stages 58, 60 of the power amplifier circuitry 36 via the signal ($V_{DET}$) at a predetermined time during ramp-up (step 600). The predetermined time may be any time step during ramp-up, such as time step 0 or time step 8, for example. It should be noted that the threshold value may be different for each time step.

If the detected current is greater than the threshold value, then the error correction value for the current time step is determined (step 604). Then, the error correction value determined in step 604 is used as the error correction value for the next time step in order to provide the corrected $V_{RAMP}$ for the next time step (step 606). The current is then determined for the next time step (step 608), and the process returns to step 602 where the detected current is compared to a threshold value for that time step. If the detected current is greater than the threshold, then the process proceeds to step 604 where the error correction value for the current time step is determined. It should be noted that the error correction value for the current time step is equal to the error correction value for the previous time step plus the current error correction value. Steps 602-608 are repeated until ramp-up is complete and the detected current no longer exceeds the threshold value (step 610). Alternatively, the process may end as soon as the detected current is no longer greater than the threshold.

As an example, assume that there are 16 time steps (time step 0-time step 15), and that the predetermined time is time step 8. It should be noted that time steps 0-14 define ramp-up, and time step 15 defines the time at which ramp-up is complete, which is the time at which $V_{RAMP}$ is equal to its peak value. The process begins by determining the current at time step 8 (step 600). Next, the detected current is compared to a threshold value for time step 8 (step 602). Assume that the detected current is greater than the threshold value, such that the process determines an error correction value ϵ for time step 8. Next, the error correction value ϵ for time step 8 is used to provide the corrected $V_{RAMP}$ for time step 9. Thus, at time step 9, $V_{RAMP}$ is provided using the error correction value ϵ for time step 8. The process then determines the current at time step 9 (step 608), and compares the detected current to a threshold value for time step 9 (step 602).

Steps 602, 604, 606, and 608 are repeatedly performed for time steps 9-15. However, if at any time the detected current no longer exceeds the threshold, then the process may stop (step 610), and the error correction values for the remaining time steps can be set equal to the error correction value for the last processed time step. For example, if error correction values are determined for time steps 8-13 and at time step 14 the detected current is not greater than the threshold for time step 14, then the error correction values for time steps 14-16 can be set equal to the error correction value for time step 13.

The current detection circuits 52 and 52' and the current limiting scheme of the present invention provide substantial opportunity for variation without departing from the spirit or scope of the present invention. For example, although the current detection circuitry 52' of FIG. 4 includes the reference current source 104 and the reference resistor 106 for calibration of the A/D converter 102, depending on the accuracy of the A/D converter 102 and the fabrication process used to fabricate the A/D converter, calibration may not be necessary. As another example, although the operation of the control system 22 with respect to FIG. 5 is described as using a single predetermined threshold value for all power levels, in an alternative embodiment, there may be a different threshold value for each of the power levels. As yet another example, although the examples above describe a single predetermined threshold value for all power levels, it should be noted that there may be a different threshold value for each of the power levels. As yet another example, the current detection circuitry 52 and 52' may be interchanged such that the current detection circuitry 52 detects the current across the resistor 98 and the inductor 100 in one embodiment and the current detection circuitry 52' detects the current across the inductor 54 in another embodiment. As yet another example, although a recursive adaptive approach is described above, other algorithms such as the Newton Raphson algorithm or a step control with forced threshold may be used to find the value for the adjustable power control signal ($V_{RAMP}$) that prevents the current in the second and third amplifier stages 58, 60 of the power amplifier circuitry 36. As yet another example, the current detection circuitry 52 may be a mirror circuit, which is commonly known in the art, that mirrors the current through the voltage regulator 68 to provide the detection signal.

Those skilled in the art will recognize improvements and modifications to the preferred embodiments of the present invention. All such improvements and modifications are considered within the scope of the concepts disclosed herein and the claims that follow.

What is claimed is:

1. A mobile terminal comprising:
   a) amplifier circuitry adapted to amplify a transmit signal based on a supply voltage;
   b) power control circuitry adapted to provide the supply voltage based on a source voltage and an adjustable power control signal having at least one value corresponding to at least one power level;
   c) current detection circuitry adapted to generate a detection signal indicative of a current in an output stage of the amplifier circuitry; and
   d) a control system adapted to:
      i) determine the current in the output stage of the amplifier circuitry during a transmit burst at one of the at least one power levels based on the detection signal; and
      ii) determine an error correction value for one of the at least one values of the adjustable power control signal corresponding to the one of the at least one power levels based on the detection signal and a predetermined threshold value.

2. The mobile terminal of claim 1 wherein the control system is further adapted to modify an ideal value of the adjustable power control signal corresponding to the one of the at least one power levels using the error correction value for a subsequent transmit burst at the one of the at least one power levels such that the current in the output stage of the amplifier circuitry is limited to the predefined threshold value.

3. The mobile terminal of claim 2 wherein the control system is further adapted to modify the ideal value by subtracting the error correction value from an ideal value of the adjustable power control signal corresponding to the one of the at least one power levels.

4. The mobile terminal of claim 1 wherein the control system is adapted to determine the error correction value if the current is greater than the predetermined threshold value.

5. The mobile terminal of claim 4 wherein the control system is further adapted to determine the error correction value based on a previous error correction value for the one of the at least one values of the adjustable power control signal corresponding to the one of the at least one power levels.

6. The mobile terminal of claim 5 wherein the control system is further adapted to determine the error correction value such that the error correction value is a sum of the previous error correction value and a current error correction value.

7. The mobile terminal of claim 6 wherein the current error correction value is proportional to a difference of the current in the output stage and the predetermined threshold value.

8. The mobile terminal of claim 6 wherein the current error correction value is essentially equal to a difference of the current in the output stage and the predetermined threshold value divided by a number essentially equal to a derivative of a known current versus adjustable power control signal characteristic of output stage for the one of the at least one values of the adjustable power control signal.

9. The mobile terminal of claim 4 wherein the control system is further adapted to determine the error correction value if the current is less than the predetermined threshold value and the previous error correction value is not equal to zero.

10. The mobile terminal of claim 1 wherein the predetermined threshold value is different for each of the at least one power levels.

11. The mobile terminal of claim 1 wherein the detection signal corresponds to the current in the output stage of the amplifier circuitry at essentially any point during the transmission burst.

12. The mobile terminal of claim 1 wherein the adjustable power control signal is provided by the control system such that the amplifier circuitry provides amplitude modulation of the transmit signal, and the control system is further adapted to determine the current based on the detection signal at a point during the transmit burst when output power of the amplifier circuitry is a known function of the adjustable power control signal.

13. The mobile terminal of claim 12 wherein the control system is further adapted to determine the current based on the detection signal at a point during the transmit burst when the amplitude modulation is essentially zero.

14. The mobile terminal of claim 1 wherein the adjustable power control signal is provided by the control system such that the amplifier circuitry provides amplitude modulation of the transmit signal, and the control system is further adapted to determine the current based on the detection signal at multiple times during the transmit burst and determine an average current in the output stage of the amplifier circuitry, where the error correction value is determined based on the average current.

15. The mobile terminal of claim 1 wherein the control system is further adapted to determine the current in the output stage of the amplifier circuitry at a point in time during ramp-up for the transmit burst.

16. The mobile terminal of claim 1 wherein the control system is further adapted to determine each of a set of error correction values for the one of the at least one power levels based on the detection signal, the set of error correction values including the error correction value and corresponding to time steps during ramp-up for the transmit burst.

17. The mobile terminal of claim 16 wherein the control system is further adapted to:
determine each of the set of error correction values based on determining the current in the output stage of the amplifier circuitry at one or more times during ramp-up of the transmit burst;

modify at least one ideal value of the adjustable power control signal based on the set of error correction values to provide the adjustable power control signal for the transmit burst, thereby providing real-time correction of the adjustable power control signal.

18. The mobile terminal of claim 1 further comprising resistive circuitry adapted to couple a voltage source providing the source voltage to the power control circuitry and wherein the current detection circuitry comprises a differential analog-to-digital converter adapted to measure a voltage across the resistive circuitry to provide the detection signal as a digital signal.

19. The mobile terminal of claim 18 wherein the current detection circuitry further comprises circuitry adapted to provide a reference voltage and wherein the analog-to-digital converter is periodically calibrated based on the reference voltage.

20. The mobile terminal of claim 18 wherein the resistive circuitry is a bond wire coupling a positive terminal of the voltage source to a terminal of the power control circuitry.

21. The mobile terminal of claim 1 further comprising inductive circuitry coupled between the power control circuitry and the amplifier circuitry such that the supply voltage is provided to the amplifier circuitry via the inductive circuitry.

22. The mobile terminal of claim 21 wherein the current detection circuitry is further adapted to provide the detection signal based on a voltage across the inductive circuitry.

23. The mobile terminal of claim 22 wherein the current detection circuitry comprises a differential amplifier having a positive input coupled to a first terminal of the inductive circuitry and a negative input coupled to a second terminal of the inductive circuitry and adapted to amplify the voltage across the inductive circuitry to provide the detection signal.

24. The mobile terminal of claim 23 wherein the current detection circuitry further comprises an analog-to-digital converter adapted to digitize the detection signal and provide a digitized detection signal to the control system.

25. The mobile terminal of claim 21 wherein the mobile terminal further comprises a first bond wire adapted to couple a first terminal of the inductive circuitry to the power control circuitry and a second bond wire adapted to couple a second terminal of the inductive circuitry to the amplifier circuitry, and the current detection circuitry is further adapted to provide the detection signal based on a voltage across the first bond wire, the inductive circuitry, and the second bond wire.

26. A method of limiting current in an output stage of a power amplifier in a mobile terminal comprising:
a) amplifying a transmit signal using amplifier circuitry based on a supply voltage;
b) providing the supply voltage based on a source voltage and an adjustable power control signal having at least one value corresponding to at least one power level;
c) generating a voltage detection signal indicative of a current in an output stage of the amplifier circuitry;
d) determining the current in an output stage of amplifier circuitry during a transmit burst at one of the at least one power levels; and
e) determining an error correction value for one of at least one values of the adjustable power control signal corresponding to the one of the at least one power levels based on the current in the output stage and a predetermined threshold value.

* * * * *